(12) United States Patent
Chang et al.

(10) Patent No.: US 6,788,598 B2
(45) Date of Patent: Sep. 7, 2004

(54) TEST KEY FOR DETECTING OVERLAP BETWEEN ACTIVE AREA AND DEEP TRENCH CAPACITOR OF A DRAM AND DETECTION METHOD THEREOF

(75) Inventors: Ming-Cheng Chang, Taoyuan Hsien (TW); Tie-Jiang Wu, Iian (TW); Jeng-Ping Lin, Taoyuan Hsien (TW); Tse-Main Kuo, Taipei (TW); Hsu-Cheng Fan, Taoyuan Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/448,661

(22) Filed: May 30, 2003

(65) Prior Publication Data

US 2004/0017710 A1 Jan. 29, 2004

(30) Foreign Application Priority Data

Jul. 23, 2002 (TW) ........................................ 91116342 A (51) Int. Cl.$^7$ ................................................ G11C 7/00
(52) U.S. Cl. .......................................... 365/201; 365/63
(58) Field of Search .................................... 365/201, 63

(56) References Cited

U.S. PATENT DOCUMENTS

| | | | | |
|---|---|---|---|---|
| 5,355,007 | A | * | 10/1994 | Smayling .................. 365/185.1 |
| 6,433,397 | B1 | * | 8/2002 | Clevenger et al. .......... 257/382 |
| 6,624,031 | B2 | * | 9/2003 | Abadeer et al. ............ 438/268 |
| 2004/0056248 | A1 | * | 3/2004 | Liu et al. ...................... 257/48 |
| 2004/0061111 | A1 | * | 4/2004 | Felber et al. .................. 257/48 |

* cited by examiner

Primary Examiner—Richard Elms
Assistant Examiner—Tuan T. Nguyen
(74) Attorney, Agent, or Firm—Quintero Law Office (57) ABSTRACT

A test key disposed on a scribe line of a wafer. The test key includes: two active areas disposed on the substrate; two first deep trench capacitors disposed on the substrate outside the two active areas; a rectangular active word line disposed on the substrate covering the first deep trench capacitors and the active areas; first and second passing word lines disposed on one side of the rectangular active word line and across the parallel active areas; a third passing word line disposed on another side of the rectangular active word line and across another end of the two active areas; two second deep trench capacitors disposed on the substrate under where the two first passing word lines overlap the two active areas; and four contacts disposed on the first active areas between the first and second word lines and between the third and the rectangular active word line.

8 Claims, 6 Drawing Sheets

TEST KEY FOR DETECTING OVERLAP BETWEEN ACTIVE AREA AND DEEP TRENCH CAPACITOR OF A DRAM AND DETECTION METHOD THEREOF

BACKGROUND OF THE INVENTION

1. Field of the Invention

The present invention relates to semiconductor layouts, and in particular to a layout for detecting overlap between active areas and deep trench capacitors in semiconductor memory cells.

2. Description of the Related Art

A semiconductor circuit usually comprises numerous features at a micron scale. These features are defined by photolithography and fabricated by multiple etching, oxidation, silicon oxide and metal deposition.

Because features on a semiconductor chip are defined by photolithography, the yield rate of semiconductor fabrication depends on alignment accuracy and the control of critical dimension effect. Thus, it is important for integrated semiconductor circuits to detect misalignment from overlap during fabrication.

Semiconductor memories such as dynamic random access memories (DRAM) typically include memory cells with storage nodes. Generally these storage nodes are formed within deep trenches etched into substrates of the semiconductor memory chip. The storage nodes are accessed using an access transistor which allows charges to be stored in the storage node or retrieves charges from the storage depending on whether the desired action is a read or write function.

The inherent leakage current inside the DRAM memory cells decreases charges in the capacitor with time. The capacitor has to be refreshed before the voltage falls below the threshold.

Figure 1:
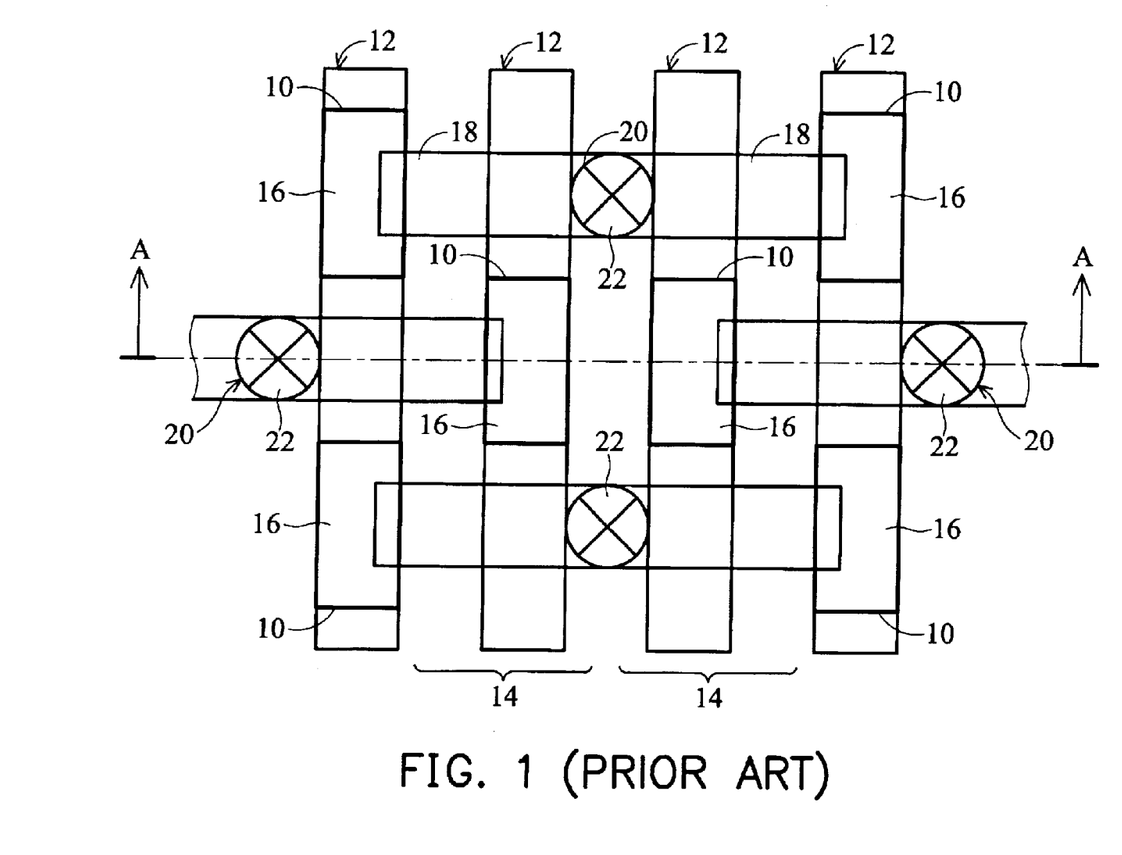
FIG. 1 is a top plan view of a memory cell layout of a conventional memory device as referenced in the Prior Art.

Referring to FIG. 1, a layout is shown for conventional deep trench capacitors. Deep trench capacitors 10 are disposed under passing word lines 12. Access transistors 14 are electrically coupled to storage nodes 16 of trench capacitors 10 through diffusion regions 18 which may be either a source or a drain of access transistors 14. Diffusion regions 20 are also included, electrically connected to contacts 22. Contacts 22 connect to bit lines (not shown) to read from and write to storage nodes 16 through access transistors 14. Access transistors 14 are activated by word lines 12. When voltage is applied to word lines 12, a channel below word line 12 conducts, allowing current to flow between diffusion regions 18 and 20 and into or out of storage node 16. Word lines 12 are preferably spaced across the smallest possible distance d to conserve layout area. The smallest possible distance is typically a minimum feature size F achievable by the technology.

Figure 2:
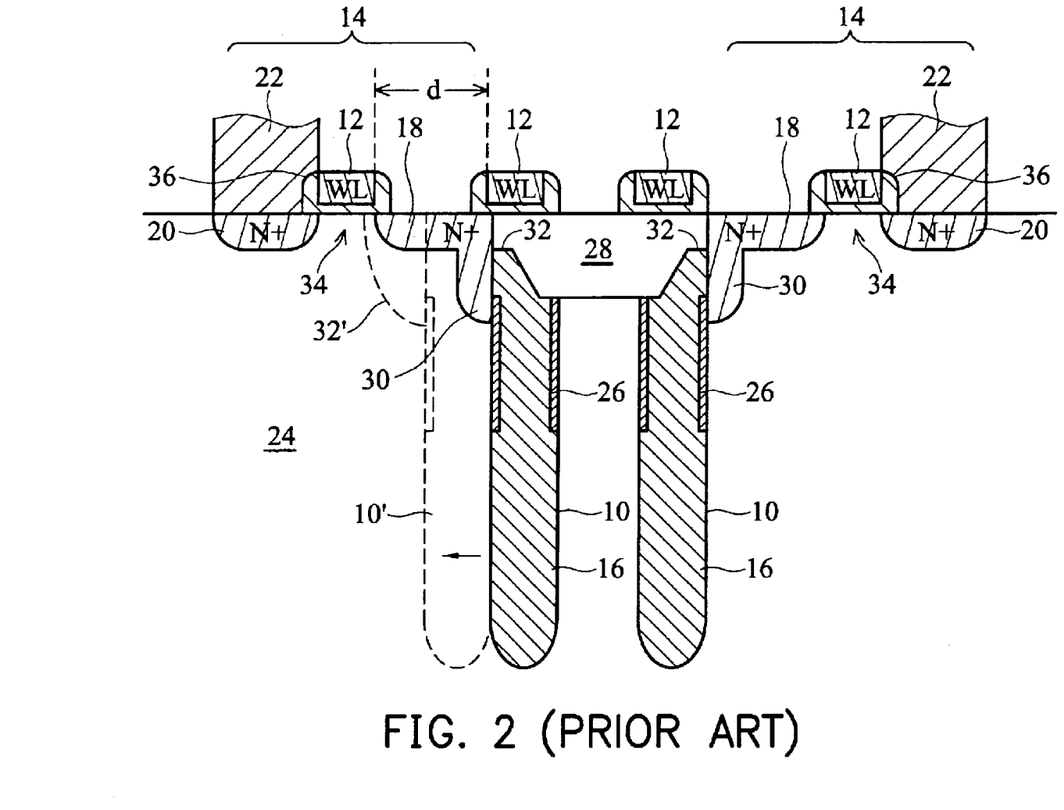
FIG. 2 is a cross-section taken at section line A—A of FIG. 1 for the memory cell.

Referring now to FIG. 2, a cross-section of the layout of FIG. 1 is shown. Elements of FIG. 2 are labeled as described in FIG. 1. Storage nodes 16 are isolated from a doped well 24 by a dielectric collar 26. Shallow trench isolation 28 is provided over storage nodes 16 to electrically isolate the passing word lines 12 formed above storage nodes 16. Diffusion regions 18 of access transistors 14 are connected to storage node 16 by a node diffusion region 30 to a buried strap 32. Node diffusion 30 and buried strap 32 are typically connected by outdiffusing dopants which mix to create a conductive region (node region 30) therebetween.

Shallow trench isolation 28 is formed on the substrate between the deep trench capacitors 10 to define the active area and isolate the deep trench capacitors 10 and following word lines 12. Word lines 12 are formed subsequently on the substrate. Source/drain areas 18/20 are formed by implantation on active areas beside the word lines 12 with word lines 12 and shallow trench isolation 28 as implant masks.

However, when the deep trech capacitors 10 misalign and shift, the interaction between the overlapped deep trench capacitor 10 and the active area decreases the reliability of the DRAM cell. Therefore, there is a need to detect the overlap of active areas and deep trench capacitors on semiconductor memories, especially for DRAM.

SUMMARY OF THE INVENTION

Accordingly, an object of the invention is to provide a test key for detecting the overlap of active areas and deep trench capacitors on dynamic random access memories (DRAM) and a detecting method therefor. The test key can be disposed on scribe lines on a wafer for inline monitoring.

A test key for detecting the overlap of active areas and deep trench capacitors on a memory cell, in accordance with the invention, includes: two parallel lines of active areas disposed on the substrate, two parallel first deep trench capacitors disposed on the substrate along the outer side of the two active areas respectively, a rectangular active word line disposed on the substrate, a first passing word line perpendicular to the two active areas disposed parallely on one side of the rectangular active word line and crossing in a substantially perpendicular fashion the two active areas, a second passing word line perpendicular to the active areas disposed parallely outside the first passing word line and crossing in a substantially perpendicular fashion one end of the two active areas, a third passing word line perpendicular to the active areas disposed parallely on the opposite side of the rectangular active word line and crossing in a substantially perpendicular fashion the opposite end of the two active areas, two second deep trench capacitors disposed on the substrate under where the two first passing word lines overlap the two active areas respectively, a first contact disposed on the first active area between the first and second passing word lines, a second contact disposed on the first active area between the third passing word line and the rectangular active word line, a third contact disposed on the second active area between the first and second passing word lines, and a fourth contact disposed on the second active area between the third passing word line and the rectangular active word line.

Preferably, the first deep trench capacitors are shorter than the first and second active areas. Moreover, the rectangular active word line disposed on the substrate covers the entire two first deep trench capacitors and covers a major part of the two active areas with equal length of the first deep trench capacitors.

A method, in accordance with the invention, is further provided to detect the shift and overlap of active areas and deep trench capacitors on a DRAM cell by means of the above test key. According to a preferred embodiment, a substrate is provided with a scribe line and a memory cell area thereon. A test key as disclosed above is formed on the scribe line and numerous memory cells are formed on the memory cell area. A first threshold voltage is obtained according to the voltage level of the first and second contacts and the first gate. A second threshold voltage is obtained according to the voltage level of the third and fourth contacts and the second gate. The overlap degree between the two active areas and the two first deep trench capacitors on the test key is evaluated based on the difference of the first and second threshold voltages. The overlap degree on the memory cells are estimated based on the overlap degree of the test key.

One feature of the present invention is to detect the misalignment of deep trench capacitors and active areas on a memory cell such that the shift degree can be further evaluated accordingly.

Another feature of the present invention is to form the test key on a scribe line of a wafer enabling inline monitoring of the misalignment between deep trench capacitors and active areas on memory cells.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 3:
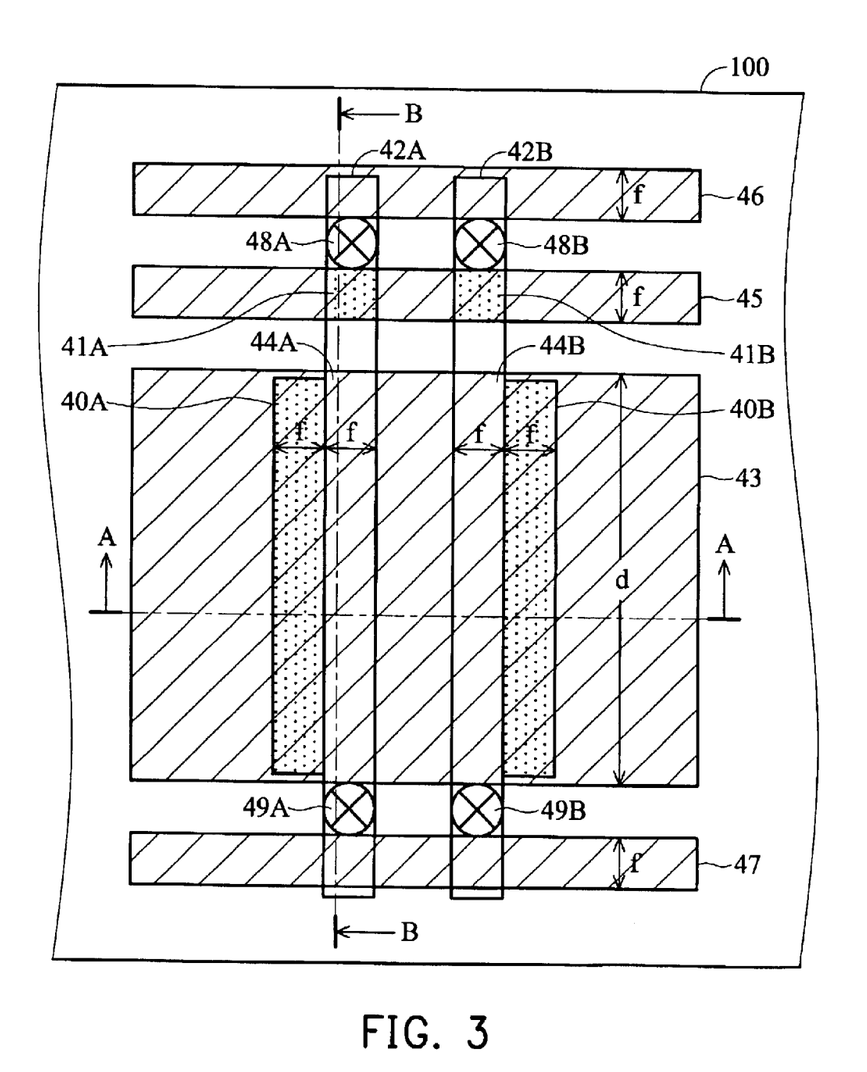
FIG. 3 is a top plan view of a test key layout for detecting the overlap of the active area and deep trench capacitors on a memory cell according to one embodiment of the invention.

FIG. 3 shows a top plan view of a test key layout for detecting the overlap of active areas and deep trench capacitors on a memory cell according to one embodiment of the invention.

In FIG. 3, two deep trench capacitors 40A and 40B are disposed parallel to each other with a width f on a scribe line (not shown) of a substrate 100. Two rectangular deep trench capacitors 41A and 41B are disposed on one side of the deep trench capacitors 40A and 40B.

Two parallel active areas 42A and 42B are disposed on the substrate 100 along the inner sides of the deep trench capacitors 40A and 40B. The widths of active areas 42A and 42B are equal and the preferred width is f. The active areas 42A and 42B are equal in length and longer than the deep trench capacitors 40A and 40B, passing over the rectangular deep trench capacitors 41A and 41B respectively.

A rectangular active word line area 43 is subsequently disposed over the deep trench capacitors 40A and 40B and the active areas 40A and 40B. As shown in FIG. 3, the preferred width d of the rectangular active word line area 43 is approximately equal to the length of the deep trench capacitors 40A and 40B. Thus, all of deep trench capacitors 40A and 40B and a major part of the active areas 42A and 42B are covered by the rectangular active word line 43. The active areas 42A and 42B covered with the rectangular active word line 43 operate as gates 44A and 44B.

In FIG. 3, on one side of the rectangular active word line 43, a first passing word line 45 is disposed perpendicularly crossing the active areas 42A and 42B and passing through the rectangular deep trench capacitors 41A and 41B as well. A second passing word line 46 is disposed on and parallel to the outer side of the first passing word line 45. Preferably, the second passing word line 46 is laid across the ends of the active areas 42A and 42B. The widths of both first and second passing word lines 45 and 46 are also preferably f.

On the opposite side of the rectangular active word line area 43, a third passing word line 47 is disposed on and parallel to the rectangular active word line 43. Preferably, the third passing word line 47 is laid across the opposite ends of the active areas 42A and 42B, with a width f as well.

Two contacts are formed between the first and second passing word lines 46 and 45 and another two are formed between the third passing word line 47 and the rectangular active word line 43. Contact 48A is formed on the active area 42A between the first and second passing word lines 45 and 46. Contact 48B is formed on the active area 42B between the first and second passing word lines 45 and 46. Contact 49A is formed on the active area 42A between the third passing word line 47 and the rectangular active word line 43. Contact 49B is formed on the active area 42B between the third passing word line 47 and the rectangular active word line 43.

Figure 4A:
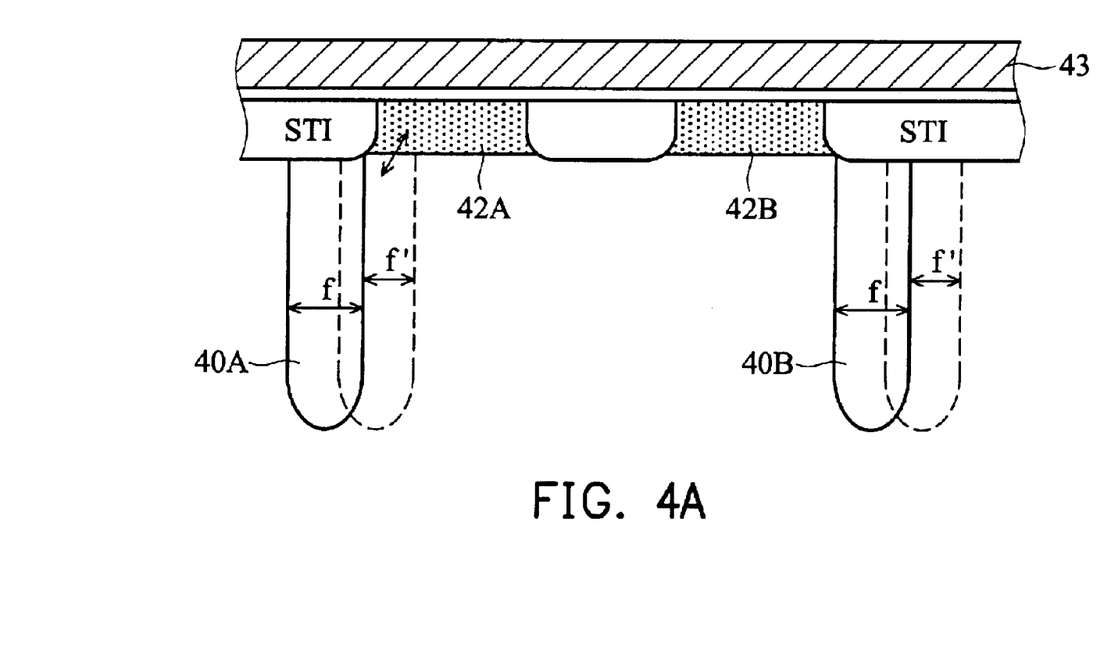
FIG. 4A is a cross-section taken at section line A—A of FIG. 3 for the test key.

FIG. 4A is a cross-section taken at section line A—A of FIG. 3 for the test key. Ideally, the dopant concentrations in active areas 42A and 42B are approximately equal to each other. However, when the deep trench capacitors 40A and 40B shift a distance f' to the right side as shown in FIG. 4A due to misalignment, the concentrated dopants in the deep trench capacitor 40A outdiffuse to increase the dopant concentration in the active area 42A. Thus, the dopant concentration of active area 42A will be higher than that of active area 42B. Similarly, if the deep trench capacitors 40A and 40B shift to the left, the dopant concentration of the active area 42B will be higher.

Figure 4B:
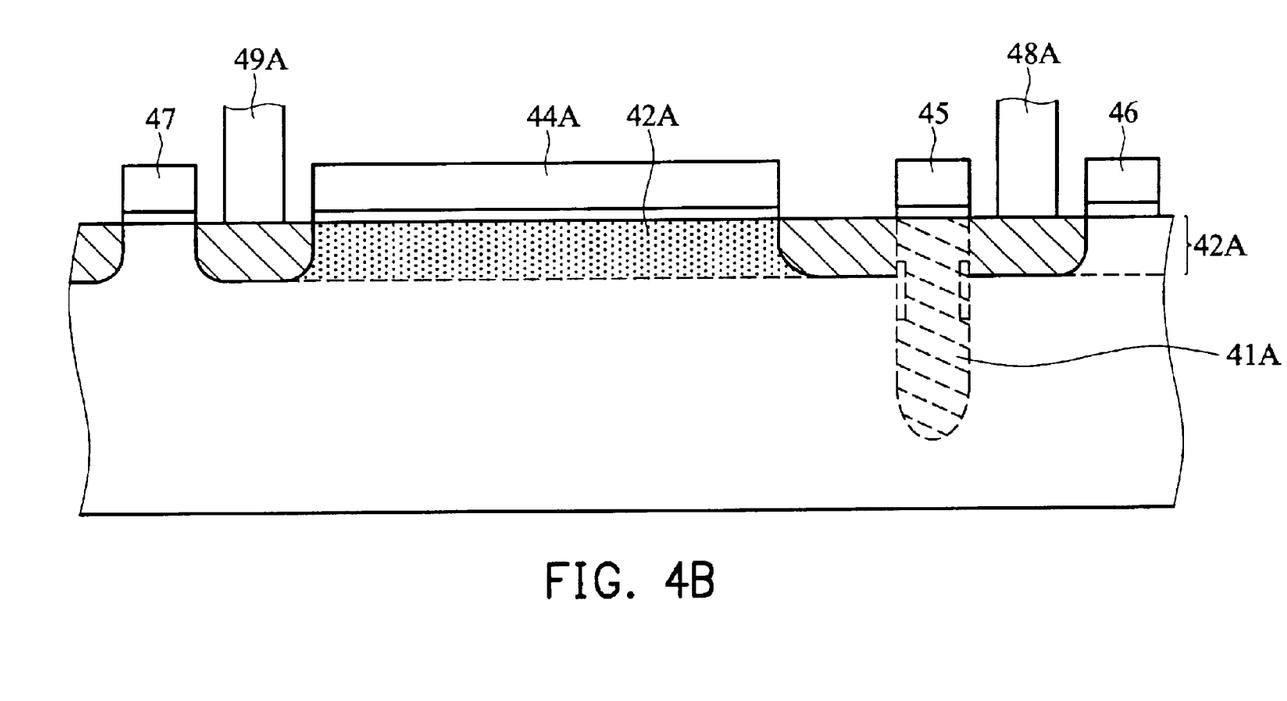
FIG. 4B is a cross-section taken at section line B—B of FIG. 3 for the test key.

FIG. 4B is a cross-section taken at section line B—B of FIG. 3 for the test key. A MOS structure is shown in FIG. 4B, the region of the active word line 43 over the active area 42A operates as a gate 44A and the doped areas beside operate as source/drain. A threshold voltage of MOS A (VtA) can be obtained based on the voltage level of gate 44A, contacts 48A and 49A. Similarly, a threshold voltage of MOS B (VtB) can be obtained based on the voltage level of gate 44B, contacts 48B and 49B.

Ideally, when mask alignment is accurate and there is no misalignment between deep trench capacitors 40A and 40B and the corresponding active areas 42A and 42B, threshold voltage of MOS A (VtA) is equal to that of MOS B (VtB). However, when the deep trench capacitors and the active areas are misaligned, as shown in the phantom lines in FIG. 4A, the dopant concentration in active area 42A is increased, thus, the threshold voltage of MOS A (VtA) decreases. Accordingly, the overlap or shift of active areas and deep trench capacitors can be evaluated by calculating the difference between the threshold voltage of MOS A and MOS B on the test key.

Figure 5:
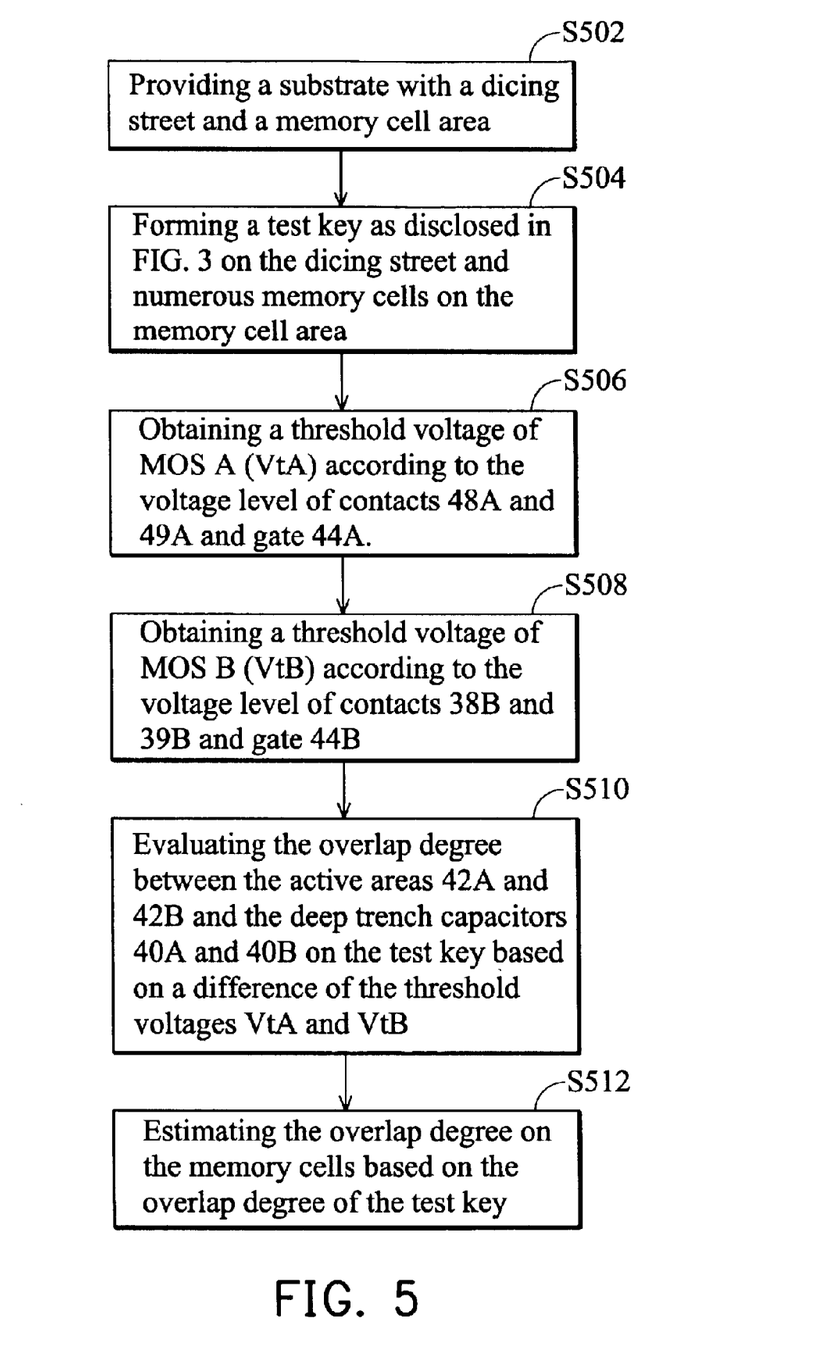
FIG. 5 is a flowchart illustrating the method of detecting the overlap of active areas and deep trench capacitors on a DRAM cell according to one embodiment of the invention.

FIG. 5 is a flowchart illustrating the method of detecting the overlap of active areas and deep trench capacitors on a DRAM cell according to one embodiment of the invention.

A substrate is provided with a scribe line and a memory cell area thereon at step S502, such as a wafer with predetermined scribe lines and die areas.

A test key layout as shown in FIG. 3 is formed on the scribe line and numerous memory cells, such as DRAM cells, are formed on the memory cell area at step S504. The test key is fabricated accompanying the memory cells.

A threshold voltage of MOS A (VtA) is obtained according to a voltage level of the contacts 48A and 49A and the gate 44A at step S506.

A threshold voltage of MOS B (VtB) is obtained according to a voltage level of the contacts 38B and 39B and the gate 44B at step S508.

At step S510, the overlap degree between the active areas 42A and 42B and the deep trench capacitors 40A and 40B on the test key is evaluated based on a difference of the threshold voltages VtA and VtB.

At step S512, the overlap degree of the memory cells can be estimated based on the overlap degree of the test key.

Since the test key and the memory cells are fabricated simultaneously, when the mask is misaligned, patterns on the test key and the memory cells on a wafer will shift together. Therefore, the overlap degree of test key on the scribe line reflects the misalignment degree of memory cells on the wafer.

In a preferred embodiment, the width d of the active word line 43 can be enlarged to magnify the misalignment of the active areas and the deep trench capacitors, without the interference of the gate shift.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A test key for detecting overlap of an active area and a deep trench capacitor on a dynamic random access memory cell, wherein the test key is disposed on a scribe line of a substrate, the test key comprising:

two parallel active areas disposed on the substrate;

two parallel first deep trench capacitors disposed on the substrate along the outer side of the two active areas respectively, wherein the first deep trench capacitors are shorter than the active areas;

a rectangular active word line disposed on the substrate, covering the two first deep trench capacitors and partially covering the two active areas of equal length to the first deep trench capacitors;

a first passing word line perpendicular to the active areas, disposed on and parallel to a first side of the rectangular active word line and approximately crossing the two parallel active areas;

a second passing word line perpendicular to the active areas, disposed parallely outside the first passing word line and crossing in a substantially perpendicular fashion a first end of the two parallel active areas;

a third passing word line perpendicular to the active areas, disposed on and parallel to a second side of the rectangular active word line and crossing in a substantially perpendicular fashion a second end of the two parallel active areas;

two second deep trench capacitors disposed under where the two first passing word lines overlap the two active areas respectively; and four contacts disposed on the two first active areas located between the first and second word lines and between the third and the rectangular active word line.

2. The test key as claimed in claim 1, wherein the widths of the first, second and third passing bit lines are equal.

3. The test key as claimed in claim 1, wherein the widths of the two active areas, the two deep trench capacitors, and the first, second and third passing word lines are equal.

4. The test key as claimed in claim 1, wherein the width of the rectangular active word line is approximately equal to the length of the first deep trench capacitor.

5. A method of detecting overlap of an active area and a deep trench capacitor on a dynamic random access memory cell, comprising the steps of:

providing a substrate with at least one scribe line and a memory cell area thereon;

forming a test key on the scribe line and a plurality of memory cells on the memory cell area simultaneously;

wherein the test key comprises:

a first and a second active area disposed parallely on the substrate;

two parallel first deep trench capacitors disposed on the substrate along the outer side of the first and the second active areas respectively, wherein the first deep trench capacitors are shorter than the first and second active areas;

a rectangular active word line disposed on the substrate, covering the two first deep trench capacitors and partially covering the first and second active areas, and the rectangular active word line over the first and second active areas operate as a first gate and a second gate respectively;

a first passing word line perpendicular to the two active areas, disposed on and parallel to a first side of the rectangular active word lines and crossing in a substantially perpendicular fashion the two parallel active areas;

a second passing word line perpendicular to the active areas, disposed parallely outside the first passing word line and crossing in a substantially perpendicular fashion a first end of the two parallel active areas;

a third passing word line perpendicular to the active areas, disposed on and parallel to a second side of the rectangular active word line and crossing in a substantially perpendicular fashion a second end of the two parallel active areas;

two second deep trench capacitors disposed under where the two first passing word lines overlap the two active areas respectively;

a first contact disposed on the first active area between the first and second passing word lines;

a second contact disposed on the first active area between the third passing word line and the rectangular active word line;

a third contact disposed on the second active area between the first and second passing word lines; and a fourth contact disposed on the second active area between the third passing word line and the rectangular active word line;

obtaining a first threshold voltage based on voltage level of the first and second contacts and the first gate;

obtaining a second threshold voltage based on voltage level of the third and fourth contacts and the second gate;

evaluating an overlap degree between the first and second active area and the two first deep trench capacitors on the test key based on a difference of the first and second threshold voltages; and estimating an overlap degree between the active areas and the deep trench capacitors on the memory cells based on the overlap degree of the test key.

6. The method as claimed in claim 5, wherein the widths of the first, second, and third passing word lines on the test key are equal.

7. The method as claimed in claim 5, wherein the widths of the first and second active areas, the two deep trench capacitors, and the first, second and third passing word lines on the test key are equal to those of the memory cells on the memory cell area.

8. The method as claimed in claim 5, wherein the width of the rectangular active word line is approximately equal to that of the first deep trench capacitor.

* * * * *